United States Patent
Hoya

(10) Patent No.: US 10,482,990 B2
(45) Date of Patent: Nov. 19, 2019

(54) MEMORY DEVICE AND MEMORY SYSTEM

(71) Applicant: TOSHIBA MEMORY CORPORATION, Minato-ku, Tokyo (JP)

(72) Inventor: Katsuhiko Hoya, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 140 days.

(21) Appl. No.: 15/699,833

(22) Filed: Sep. 8, 2017

(65) Prior Publication Data

US 2017/0372798 A1 Dec. 28, 2017

Related U.S. Application Data

(63) Continuation of application No. PCT/JP2015/076371, filed on Sep. 10, 2015.
(Continued)

(51) Int. Cl.
*G11C 29/00* (2006.01)
*G11C 29/42* (2006.01)
(Continued)

(52) U.S. Cl.
CPC .......... *G11C 29/42* (2013.01); *G06F 11/106* (2013.01); *G11C 11/1677* (2013.01);
(Continued)

(58) Field of Classification Search
CPC .......... G06F 11/106; G06F 2211/1085; G11C 29/42; G11C 29/52; G11C 11/1677;
(Continued)

(56) References Cited

U.S. PATENT DOCUMENTS 6,292,869 B1 * 9/2001 Gerchman ............ G11C 11/406
365/222
6,349,390 B1 * 2/2002 Dell .................... G06F 11/106
714/6.24
(Continued)

FOREIGN PATENT DOCUMENTS

JP 2012022726 A 2/2012
JP 2012238376 A 12/2012
(Continued)

OTHER PUBLICATIONS

International Search Report (ISR) and Written Opinion dated Nov. 24, 2015 issued in International Application No. PCT/JP2015/076371.
(Continued)

*Primary Examiner* — Albert Decady
*Assistant Examiner* — Osman M Alshack
(74) *Attorney, Agent, or Firm* — Holtz, Holtz & Volek PC

(57) ABSTRACT

A memory device of one embodiment includes memory elements which store data and parity; a first decoder which, when scrubbing of the data is performed while no external access is being made to the memory device, uses a syndrome generated from the data and the parity to correct an error of a maximum of N bits in a unit of the data; and a second decoder which, when reading of the data is performed, uses the syndrome to correct an error of a maximum of M bits in a unit of the data. The N bits represent the number of bits smaller than the N bits.

19 Claims, 13 Drawing Sheets

Related U.S. Application Data

(60) Provisional application No. 62/131,113, filed on Mar. 10, 2015.

(51) Int. Cl.
  *G11C 29/52* (2006.01)
  *G11C 11/16* (2006.01)
  *G06F 11/10* (2006.01)
  *G11C 16/34* (2006.01)
  *G11C 29/04* (2006.01)

(52) U.S. Cl.
  CPC ............ *G11C 29/52* (2013.01); *G11C 16/349* (2013.01); *G11C 2029/0409* (2013.01); *G11C 2029/0411* (2013.01)

(58) Field of Classification Search
  CPC .......... G11C 16/349; G11C 2029/0409; G11C 2029/0411
  USPC ................................ 714/752, 755, 763, 758
  See application file for complete search history.

(56) References Cited

U.S. PATENT DOCUMENTS

| | | | | |
|---|---|---|---|---|
| 7,647,526 | B1* | 1/2010 | Taylor | G06F 11/1092 714/6.32 |
| 8,176,388 | B1* | 5/2012 | Moshe | G06F 11/106 714/764 |
| 9,454,451 | B2* | 9/2016 | Campbell | G06F 11/3037 |
| 2003/0009721 | A1* | 1/2003 | Hsu | G06F 11/106 714/773 |
| 2007/0058410 | A1 | 3/2007 | Rajan | |
| 2011/0078538 | A1 | 3/2011 | Ikegawa et al. | |
| 2012/0317352 | A1* | 12/2012 | Kang | G11C 11/40611 711/106 |
| 2013/0173970 | A1* | 7/2013 | Kleveland | G11C 29/44 714/710 |
| 2014/0052931 | A1* | 2/2014 | Ramaraju | G06F 11/1064 711/143 |
| 2014/0157065 | A1 | 6/2014 | Ong | |
| 2015/0278037 | A1* | 10/2015 | Wada | G06F 11/1484 714/758 |
| 2016/0062830 | A1* | 3/2016 | Cha | G11C 29/52 714/764 |
| 2016/0246679 | A1* | 8/2016 | Kim | G06F 11/1402 |
| 2016/0336971 | A1* | 11/2016 | Fong | H03M 13/616 |

FOREIGN PATENT DOCUMENTS

| | | |
|---|---|---|
| JP | 2014110073 A | 6/2014 |
| WO | 2013014974 A1 | 1/2013 |

OTHER PUBLICATIONS

Taiwanese Office Action issued in Taiwanese Application No. 104135893.

\* cited by examiner

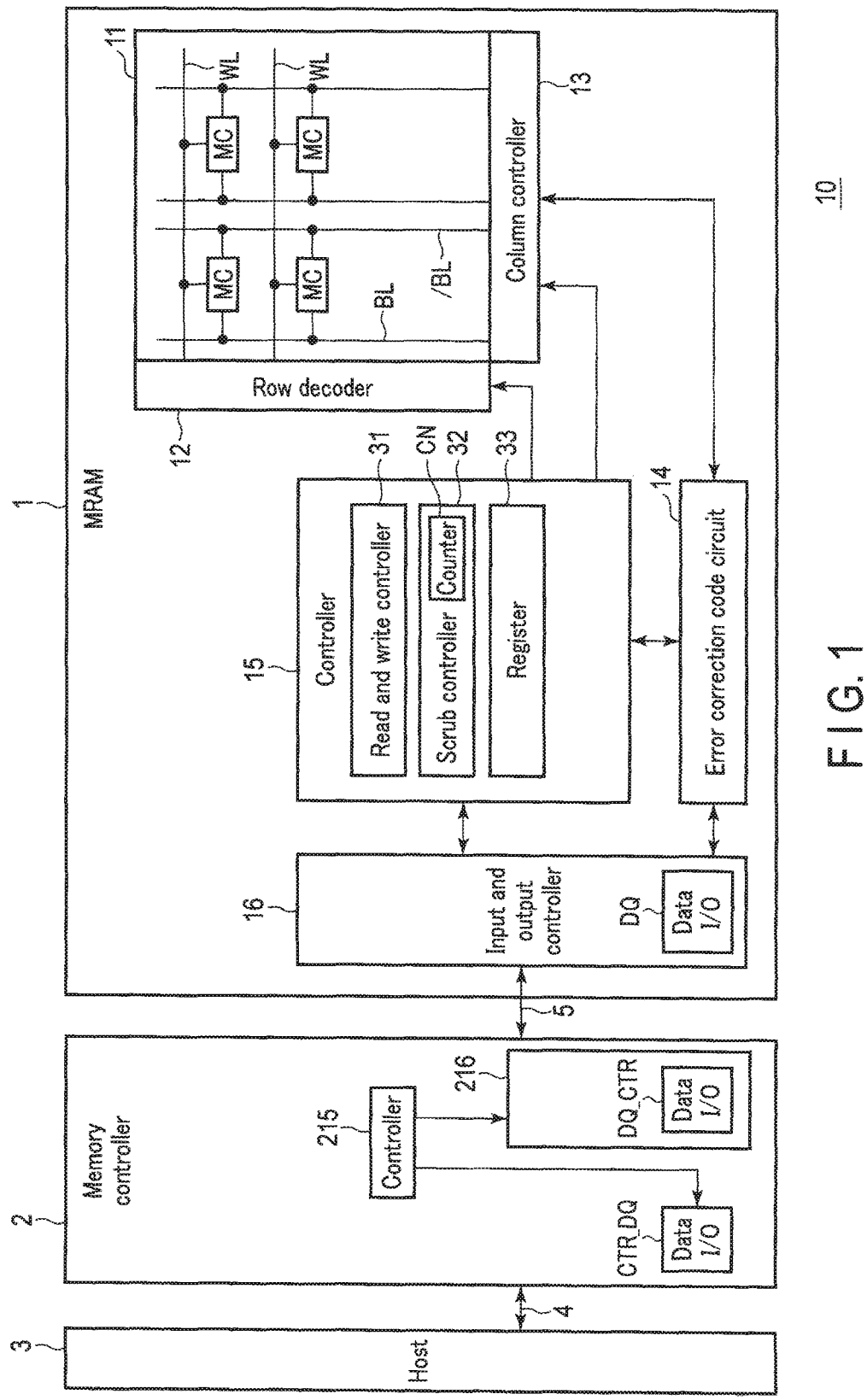
F I G. 1

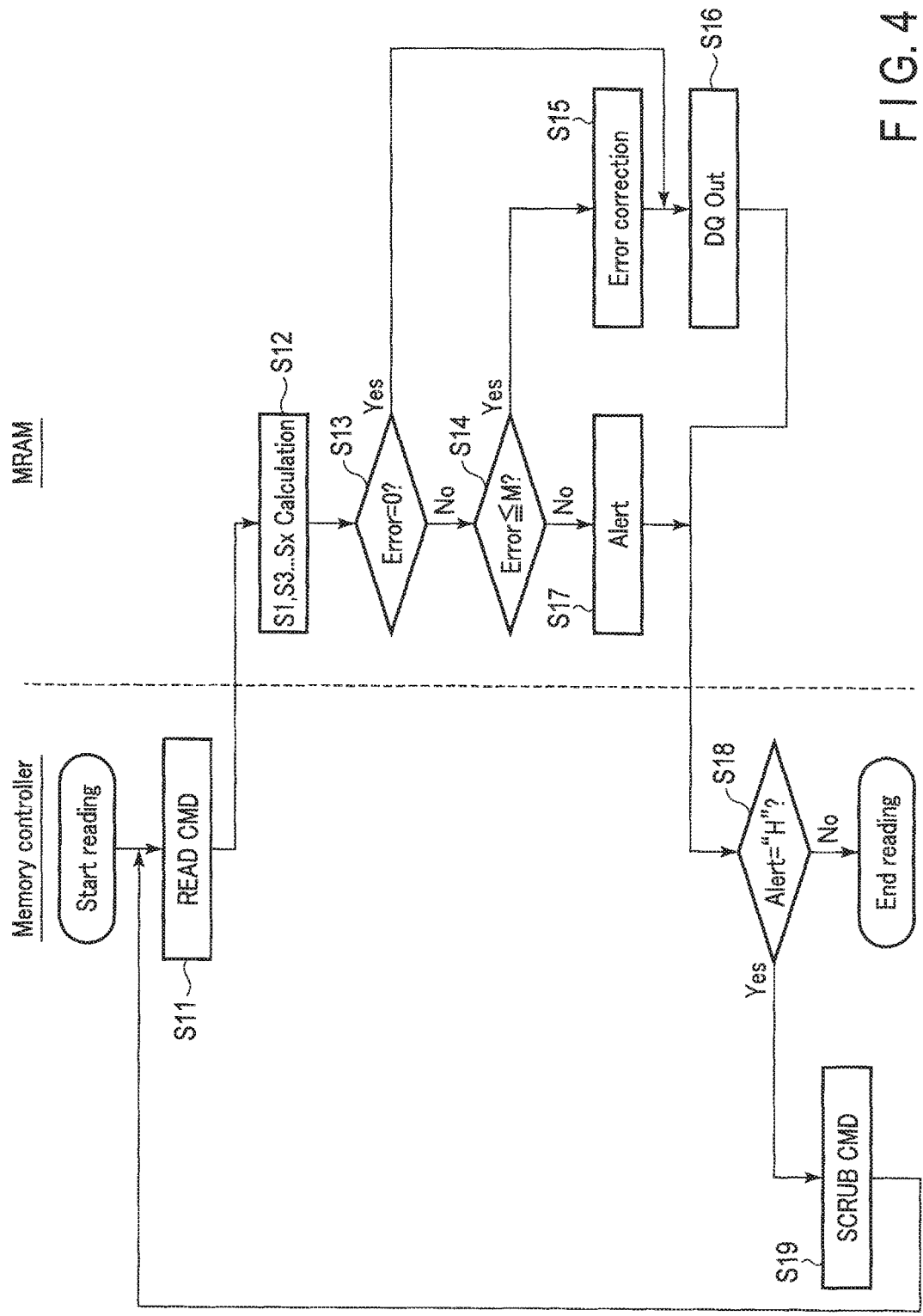
F I G. 4

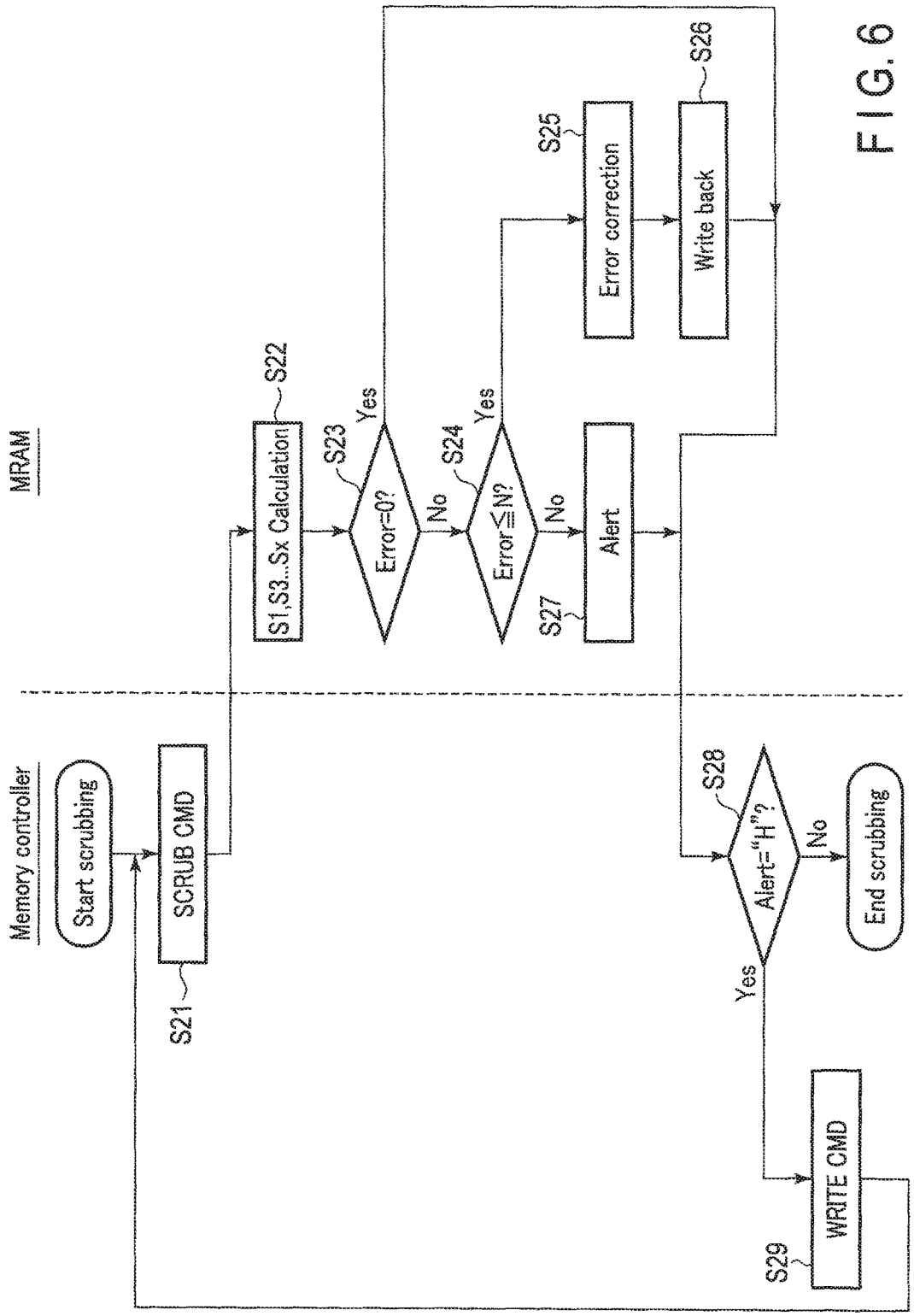
F I G. 6

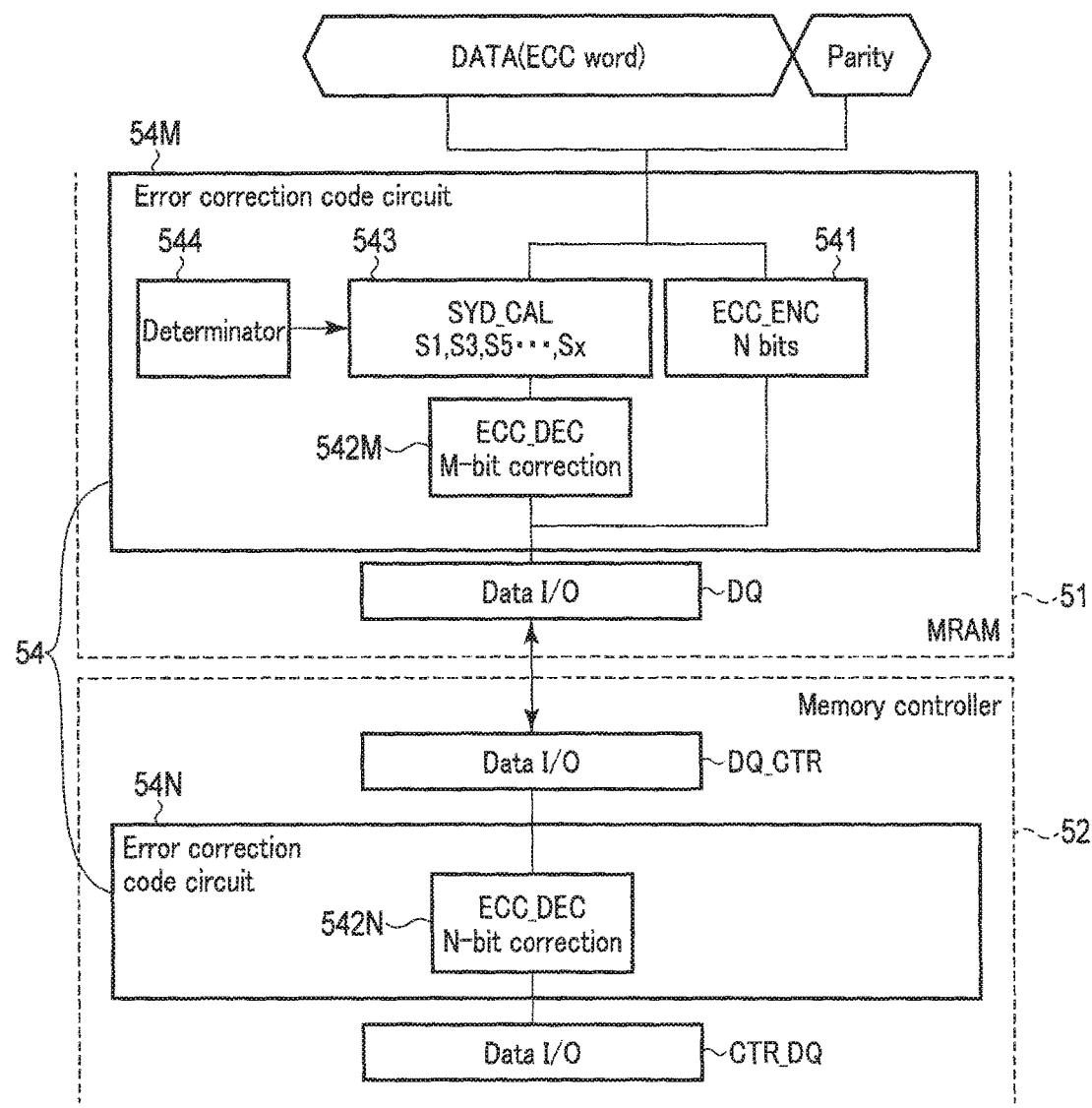
F I G. 11

MEMORY DEVICE AND MEMORY SYSTEM

CROSS-REFERENCE TO RELATED APPLICATIONS

This application is a Continuation Application of PCT Application No. PCT/JP2015/076371, filed Sep. 10, 2015 and based upon and claiming the benefit of U.S. Provisional Application No. 62/131,113, filed Mar. 10, 2015, the entire contents of which are incorporated herein by reference.

FIELD

Embodiments described herein relate generally to a memory device and a memory system.

BACKGROUND

A memory device using a magnetoresistance element is known as a magnetic memory device included in a memory system.

BRIEF DESCRIPTION OF THE DRAWINGS

FIG. 1 illustrates an example of functional blocks of a memory system according to a first embodiment;

FIG. 4 illustrates the flow of a reading operation of a memory system according to the first embodiment;

FIG. 6 illustrates the flow of a scrubbing operation of the memory system according to the first embodiment;

FIG. 11 schematically illustrates an example of the structure of an error correction circuit included in a memory system according to a third embodiment;

DETAILED DESCRIPTION

Figure 2:
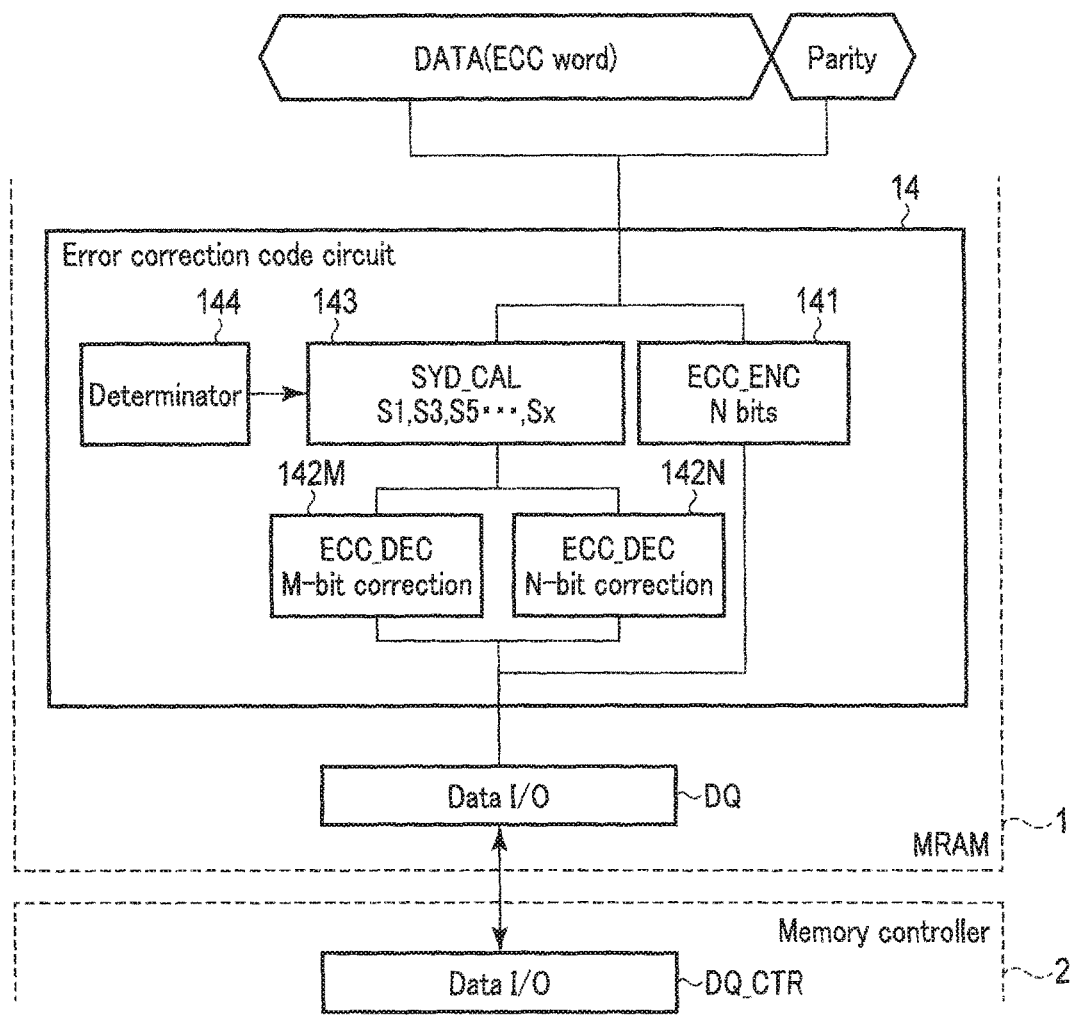
FIG. 2 schematically illustrates an example of the structure of an error correction circuit included in a magnetic memory device according to the first embodiment.

A magnetic memory device includes plural memory cells. Each memory cell includes, for example, a magnetoresistance element. The magnetoresistance element can store data by taking either one of two states of resistance.

However, the magnetoresistance element is likely to change its resistance state to flip the stored data unintentionally.

According to embodiments described below, the flipped data is detected as an error, and the data is written back a during time in which a user is not accessing a magnetic memory device (i.e., in which a memory controller is receiving no instruction from the user via a host device and is performing no data check or no re-writing, in other words in an idle time of the magnetic memory device). This operation is referred to as "scrubbing". According to the embodiments below, scrubbing can be performed to improve a reliability of the memory device, while maintaining a high speed performance of the memory device. Specifically, a memory device of one embodiment includes memory elements which store data and parity; a first decoder which, when scrubbing of the data is performed while no external access is being made to the memory device, uses a syndrome generated from the data and the parity to correct an error of a maximum of N bits in a unit of the data; and a second decoder which, when reading of the data is performed, uses the syndrome to correct an error of a maximum of M bits in a unit of the data. The M bits represent the number of bits smaller than the N bits.

The embodiments will be described below by referring to the accompanying drawings. In the drawings, similar components will be indicated by the same reference signs. Each functional block does not necessarily need to be distinguished as in the following examples. For example, some of the functions may be implemented by functional blocks different from those illustrated below. Furthermore, an illustrated functional block may be divided into functional sub-blocks.

First Embodiment

A memory device and a memory system according to the present embodiment will be described. The memory device according to the present embodiment is a magnetic memory device, such as a spin-transfer torque (STT)-type, magnetoresistive random access memory (MRAM). In the MRAM, a magnetic tunnel junction (MTJ) element, which is a magnetoresistance element, is used as a memory element.

(1) Example of Memory System Structure

First, by referring to FIG. 1, an example of the structure of a memory system according to the present embodiment will be described. FIG. 1 illustrates an exemplary functional block diagram of a memory system according to the present embodiment.

As illustrated in FIG. 1, a memory system 10 includes an STT-type MRAM 1 as a magnetic memory device, a memory controller 2, and a host device 3.

The host device 3 gives an instruction of operations, such as writing and reading operations in the MRAM 1, to the memory controller 2. The host device 3 is communicably connected to the memory controller 2 by a connecting line 4. The connecting line 4 includes, for example, a power source line, a data bus, a command line, and so on.

The memory controller 2 transmits various commands to the MRAM 1 according to the instruction from the host device 3, and instructs the MRAM 1 on operations such as data writing and reading operations. The memory controller 2 transmits an address into which data will be written and an address from which data will be read to the MRAM 1, and designates an area subjected to the operation such as writing or reading among memory areas of the MRAM 1.

In addition, the memory controller 2 autonomously transmits a scrub command to the MRAM 1 independent of the instruction from the host device 3, and gives an instruction of a data scrubbing operation to the MRAM 1. The scrubbing operation includes checking and re-writing of data held in the memory cell MC. Re-writing of data may be performed as needed.

The memory controller 2 includes controller 215, an input and output controller 216, and a data input and output unit CTR_DQ, and so on. The controller 215 controls the entire operation of the memory controller 2, including the operations of the data input and output unit CTR_DQ and the input and output controller 216. The data input and output unit CTR_DQ is connected to the host device 3 via the connecting line 4 and controls transmission and reception of data to and from the host device 3. The input and output controller 216 includes a data input and output unit DQ_CTR and is communicably connected to the MRAM 1 via the connecting line 5. The connecting line 5 includes, for example, a power source line, a data bus, a command line, and so on.

The above-described functions of the memory controller 2 may be implemented by a processor, such as a central processing unit (CPU), and hardware, such as a read only memory (ROM) and a random access memory (RAM). For example, a program held in a ROM may be read on a RAM and a program in the RAM may be executed by the CPU to perform the operation of the memory controller 2.

The MRAM 1 includes a memory cell array 11, a row decoder 12, a column controller 13, an error correction code (ECC) circuit 14, a controller 15, and an input and output controller 16. The MRAM 1 performs operations such as writing, reading, and scrubbing according to various types of commands from the memory controller 2.

The memory cell array 11 includes plural memory cells MC. The memory cells MC are connected to plural bit lines BL and corresponding bit lines /BL that make pairs with the bit lines BL, and plural word lines WL.

A memory cell MC includes an MTJ element and a cell transistor. The MTJ element can hold data using a magnetoresistance effect. The cell transistor is connected in series with the MTJ element and controls supplying and stopping of a current to the MTJ element.

More specifically, the MTJ element includes two magnetic layers and a non-magnetic layer between the two magnetic layers. In the first magnetic layer, an orientation of magnetization or magnetic anisotropy is invariable. In the second magnetic layer, an orientation of magnetization or magnetic anisotropy is variable. When a writing current flows from the first magnetic layer toward the second magnetic layer, the orientations of magnetization of two magnetic layers become parallel with each other. When the magnetization orientations of the two magnetic layers are parallel, the MTJ element exhibits the minimum resistance value. When the writing current flows from the second magnetic layer toward the first magnetic layer, the orientations of magnetization of two magnetic layers become antiparallel with each other. When the magnetization orientations of the two magnetic layers are antiparallel with each other, the MTJ element exhibits the maximum resistance value. These two states representing two different resistance values are assigned to binary data.

The row decoder 12 is connected to the word lines WL. The row decoder 12 selects one of the word lines WL according to a row address.

The column controller 13 is connected to the bit line pairs BL, /BL. The column controller 13 includes a column decoder, a column selector, a sense amplifier, a write driver, and so on. The column controller 13 selects a pair among the bit line pairs BL, /BL according to a column address, and writes data to a selected memory cell MC or reads out, data from the selected memory cell MC.

The error correction circuit 14 processes write data from the memory controller 2 and transfers the write data the column controller 13. The error correction circuit 14 corrects an error of the data received from the column controller 13. The error correction circuit 14 will be described in detail later.

The input and output controller 16 controls signal transmission between the MRAM 1 and the memory controller 2. The input and output controller 16 supplies a command and an address from the memory controller 2 to the controller 15. The input and output controller 16 also includes the data input and output unit DQ. The data input and output unit DQ is controlled by the input and output controller 16 to receive write data from the memory controller 2 and transmit the write data to the error correction circuit 14. Also, the data input and output unit DQ is controlled by the input and output controller 16 to transmit data from the error correction circuit 14 as read data to the memory controller 2.

The controller 15 includes a read and write controller 31, a scrub controller 32, a register 33, a command decoder, a latch, a buffer, a voltage generator, and so on. The controller 15 controls components of the MRAM 1 according to the command and the address from the memory controller 2.

The read and write controller 31 controls reading and writing data from and to the memory cell array 11. The read and write controller 31 controls the row decoder 12 and the column controller 13 according to the command and the address. Accordingly, the data is read from or written to one or more memory cells MC specified by the address.

The scrub controller 32 controls the scrubbing operation. Upon reception of a scrub command from the memory controller 2, the scrub controller 32 performs scrubbing of data held by the memory cells MC. An extent of the memory cells MC to which the scrubbing operation is performed at a time is referred to as a scrub execution unit and is determined in advance. The scrub execution unit may be determined based on, for example, the number of memory cells MC that are read together. Alternatively, the scrub execution unit may be determined based on locations of the memory cells MC in the memory cell array 11.

The scrub controller 32 may include, for example, a counter CN. The scrub controller 32 uses the counter CN to manage the addresses of the memory cells MC for each scrub execution unit. The counter CN holds the address of a memory cell MC that has been the last target of the scrubbing operation. Each time the MRAM 1 receives the scrub command and the scrubbing operation is performed, the scrub controller 32 increments the address possessed by the counter CN.

The register 33 holds data regarding the scrubbing operation, such as the address of a memory cell MC that holds erroneous data.

(2) Example of Error Correction Circuit Structure

The error correction circuit 14 will now be described in detail by referring to FIG. 2. FIG. 2 schematically illustrates an example of the structure of the error correction circuit included in the magnetic memory device according to the present embodiment.

As illustrated in FIG. 2, the error correction circuit 14 includes an ECC encoder 141, ECC decoders 142M, 142N, syndrome generator 143, and a determinator 144.

The error correction circuit 14 processes write data (a string of 1 and 0 bits) by the ECC encoder 141 and transfers processed data to the column controller 13.

Specifically, the write data is transmitted from the memory controller 2 to the data input and output unit DQ. In the data input and output unit DQ, the input and output controller 16 divides the write data into plural data units, with each data unit having a predetermined number of bits. Each divided data unit may also be referred to as, for example, an ECC word. These ECC words are transferred to the error correction circuit 14.

The ECC encoder 141 generates an error correction code (parity) from an ECC word and couples the parity with the ECC word. The parity is a bit string or the like formed in compliance with a predetermined error correction code generation rule and used in subsequent error detection. The number of bits of the ECC word is also predetermined in compliance with the error correction code generation rule.

The error correction code generation rule used in the error correction circuit 14 is configured to allow detection of an error having the maximum of N bits for each data unit or, in other words, an ECC word. That is, the parity is generated in compliance with the error correction code generation rule in such a manner that the parity can be used in error detection of the error having the maximum of N bits. Various error correction code generation rules have been known. For example, the error correction code generation rule used in the error correction circuit 14 may be selected from those known error correction code generation rules.

The ECC encoder 141 performs data processing during, for example, the writing operation. A set of the ECC word and the parity is transferred to the column controller 13 and written in memory cell MC.

The error correction circuit 14 corrects an error in read data using the ECC decoder 142M or 142N, and the syndrome generator 143.

Specifically, the error correction circuit. 14 receives data read from memory cell MC. Similar to the data at writing, the data read from the memory cell MC includes sets of an ECC word and the parity.

The syndrome generator 143 calculates a syndrome according to a decode matrix, which complies with the error correction code generation rule described above, and the sets of the ECC word and parity. The syndrome may be obtained, for example, by multiplying the bit string in which the sets of the ECC word and parity are concatenated, by the decode matrix. The syndrome is a bit string or the like including error information of data. The error information of data may include, for example, information regarding the presence or absence of an error in the individual ECC words, information regarding identification of a bit position of the error, information regarding the number of erroneous bits, and so on. The syndrome generator 143 complies with the error correction code generation rule used in the error correction circuit 14, and can generate a syndrome capable of detecting an error having the maximum of N bits for each data unit. That is, the syndrome generator 143 uses the decode matrix capable of detecting an error having the maximum of N bits for each data unit.

The determinator 144 determines whether the number of erroneous bits exceed certain criteria. Specifically, the determinator 144 refers to the syndrome to determine whether the number of erroneous bits is zero, or equal to or smaller than either M bits or N bits.

The ECC decoder 142N can correct an error having the maximum of N bits for each data unit based on the error information included in the syndrome. The ECC decoder 142N identifies error positions or the like of the maximum of N bits for each data unit by performing operation with the syndrome and an error correction polynomial that complies with the error correction code generation rule. To identify the error positions of the maximum of N bits for each data unit to thereby enable the error correction, the error correction polynomial of, for example, an N-th degree equation with N unknowns may be used. At identified error positions, the ECC decoder 142N inverts data "0" and data "1". Accordingly, the error having the maximum of N bits for each data unit is corrected. The ECC decoder 142N performs the error correction during, for example, the scrubbing operation.

The ECC decoder 142M can correct the error having the maximum of M bits for each data unit according to the error information included in the syndrome. The M bits is smaller than the N bits mentioned above. The ECC decoder 142M identifies error positions or the like of the maximum of M bits for each data unit by performing operation with the syndrome and a polynomial simplified from the error correction polynomial used in the ECC decoder 142N, or, a lower degree error correction polynomial. To identify the error positions of the maximum of M bits for each data unit to thereby enable the error correction, the error correction polynomial of, for example, an M-th degree equation with M unknowns may be used. The ECC decoder 142M inverts the data located at identified error positions. Accordingly, the error having the maximum of M bits for each data unit is corrected. The ECC decoder 142M performs the error correction during, for example, the reading operation.

The number of the erroneous bits, such as N bits or M bits, is determined by balancing, for example, a time required for the error correction with a reliability required for the data. As the number of bits to be corrected increases, a longer time is necessary for the error correction, and vice versa. The time required for the error correction also depends on the size of data to be handled by a single reading or scrubbing operation. As the size of the data increases, a longer time is necessary for the error correction, and vice versa. Meanwhile, as the number of correctable bits increases, the reliability of data is improved, and vice versa. In view of the above, the number of erroneous hits, such as N bits or M bits, may be determined as below.

N represents the maximum number of correctable erroneous bits for each data unit in the scrubbing operation. The scrubbing operation may be performed, for example, to ensure a reliability of held data. A high reliability, therefore, is required. Meanwhile, the scrubbing operation is performed by using time while, for example, no external access is being made to the MRAM 1 or the like (i.e., during an idle time of the MRAM 1), which will be described later. Even when the time taken for the error correction becomes longer to a certain extent, there would not be a significant influence on the speed of operation of the MRAM 1. Further, the size of the data to be handled by a single scrubbing operation is equivalent to the scrub execution unit mentioned above. By setting the scrub execution unit properly, it is possible to adjust the error correction time. It is therefore preferable to set N to a largest possible value that falls within a range not to influence the operation speed of the MRAM 1.

M represents the maximum number of correctable erroneous bits for each data unit in the reading operation. In the reading operation, the MRAM 1 needs to quickly send data requested by the memory controller 2 to the memory controller 2. A time allocated for the error correction, and therefore the number of correctable erroneous bits during the reading operation, are limited. In the reading operation, handling of a data mask, the size of the data to be read, and so on have to be considered. In view of these points, the number of correctable erroneous bits may also be restricted. M is therefore set to a value smaller than. N to minimize the influence on a data reading speed, while maintaining the reliability required for the read data.

(3) Operation Example of Memory System

An operation example of the memory system 10 will now be described by referring to FIGS. 3 to 6.

Example of Transition of State of Magnetic Memory Device

Figure 3:
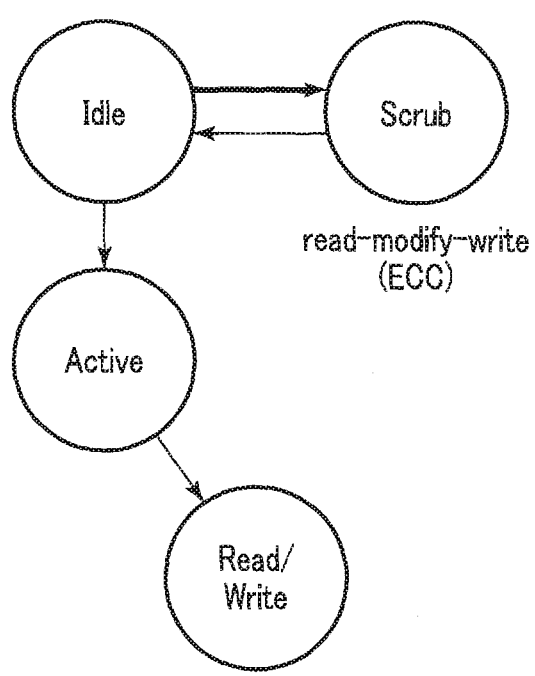
FIG. 3 illustrates how the state of the magnetic memory device changes according to the first embodiment.

First, by referring to FIG. 3, description will be given of an example of transition of state of the MRAM 1, on which various operations are based. FIG. 3 illustrates how the state of the magnetic memory device changes according to the present embodiment.

As illustrated in FIG. 3, the MRAM 1 has an idle state and an active state.

In the idle state, the MRAM 1 does not perform operations, such as writing, reading, and scrubbing.

In the active state, the MRAM 1 can perform operations, such as writing or reading. The state of the MRAM 1 changes from the idle state to the active state in response to an active command from the memory controller 2. In the active state, the MRM 1 can accept a command such as a write command or a read command from the memory controller 2.

In contrast, the MRAM 1 can directly change its state from the idle state to the scrubbing operation. That is, the MRAM 1 can receive a scrub command from the memory controller 2 in the idle state. In response to the scrub command, the MRAM 1 starts the scrubbing operation. The scrubbing operation includes a series of operations, such as reading, correcting an error by the error correction circuit 14, and resuming writing. Such operations may also be referred to as a "read-modify-write" operation.

In view of the above, the flow of the operation of the MRAM 1 and the memory controller 2 in the operations such as writing, reading, and scrubbing will be described below.

Example of Writing Operation

An example of the writing operation of the memory system 10 will be described.

Upon receipt of a writing instruction from the host device 3, the controller 215 of the memory controller 2 issues a write command and transmits the write command with write data and a destination address of writing to the MRAM 1.

The input and output controller 16 of the MRAM 1 transfers the write command and the destination address of writing to the controller 15. The controller 15 transfers a row address of the destination address of writing to the row decoder 12, and a column address to the column controller 13.

The input and output controller 16 of the MRAM 1 also divides the write data into plural ECC words. The data divided into the ECC words are transferred to the error correction circuit 14. The ECC encoder 141 generates parity from the individual ECC words and concatenates the ECC words with the parity. The error correction circuit 14 outputs sets of the ECC word and parity to the column controller 13.

The row decoder 12 and the column controller 13 select a write-target memory cell MC according to the row address and the column address. The read and write controller 31 of the controller 15 writes tile ECC word and parity to the selected memory cell MC according to the write command.

The writing operation is then completed.

Example of Reading Operation

Figure 5:
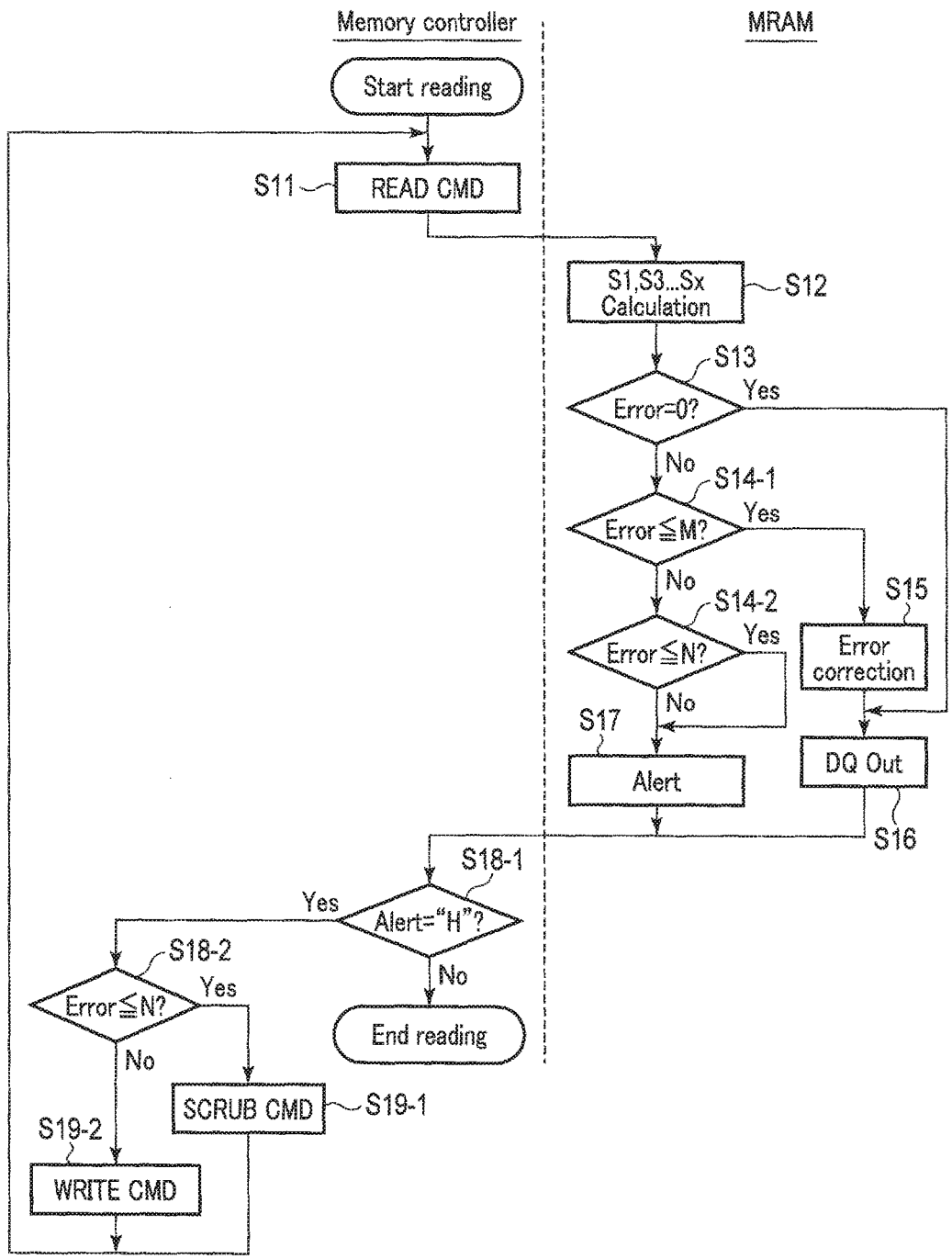
FIG. 5 illustrates the flow of another example of the reading operation of the memory system according to the first embodiment.

An example of the reading operation of the memory system 10 will now be described by referring to FIGS. 4 and 5. FIG. 4 illustrates the flow of the reading operation of the memory system according to the present embodiment. FIG. 5 illustrates the flow of another example of the reading operation of the memory system according to the present embodiment. FIGS. 4 and 5 mainly illustrate operations regarding the error correction.

As illustrated in FIG. 4, upon receipt of a reading instruction from the host device 3, the controller 215 of the memory controller 2 issues a read command and transmits the read command to the MRAM 1 with the source address of reading (step S11).

The input and output controller 16 of the MRAM 1 transfers the read command and the source address of reading to the controller 15. The controller 15 transfers a row address of the source address of reading to the row decoder 12, while transferring a column address to the column controller 13.

The row decoder 12 and the column controller 13 select read target memory cells MC according to the row address and the column address. The read and write controller 31 causes the column controller 13 to read data from the selected memory cells MC according to the read command.

The column controller 13 transfers the read data to the error correction circuit 14. The syndrome generator 143 calculates a syndrome (e.g. S1, S3, . . . , Sx) from the ECC word and parity included in the read data (step S12).

The determinator 144 determines whether the number erroneous bits in the ECC word is zero from the error information included in the syndrome (step S13). A determination result is transmitted to the read and write controller 31. If the number of the erroneous bits is zero, the read and write controller 31 transfers the ECC word as it is in the error correction circuit 14 to the input and output controller 16.

If the number of the erroneous bits is not zero, the determinator 144 determines whether the number of the erroneous bits in the ECC word is equal to or smaller than M bits according to the error information included in the syndrome (step 14).

If the number of erroneous bits is equal to or smaller than M bits, the read and write controller 31 causes the ECC decoder 142M to perform correction of the error having the maximum of M bits on the ECC word (step S15). The read and write controller 31 transfers the data to which the error correction has been performed in the ECC decoder 142M to the input and output controller 16.

With the control by the read and write controller 31, the data input and output unit DQ receives the ECC word or the error-corrected data from the ECC decoder 142M, and transmits the ECC word or the data to the memory controller 2 as read data (step S16).

When the number of erroneous bits is larger than M bits, the error section circuit 14 issues an alert instead of performing the error correction (step S17). The MRAM 1 transmits the data including the error to the memory controller 2.

The memory controller 2 determines whether the alert is received, or whether a signal regarding the alert is at the "H" level, (step S18). For example, if the memory controller 2 has not received the alert within a fixed period after transmission of the read command (i.e., the signal regarding the alert is at the "L" level), the memory controller 2 determines that the reading operation has completed.

When the memory controller 2 has received the alert, the data that has caused the occurrence of the alert may include many errors such that the data as it is may be unreliable. The memory controller 2 may issue, for example, the scrub command so as to cause the MRAM 1 to perform the scrubbing operation (step S19). When the scrubbing operation has completed, the memory controller 2 may cause the MRAM 1 to read the data again to confirm whether the number of erroneous bits has decreased.

The memory controller 2 may respond to the occurrence of the alert by performing an operation other than the scrubbing operation. The memory controller 2 may issue, for example, a write command to cause the MRAM 1 to perform the writing operation (re-writing operation). To perform re-writing, it is necessary for the data to be able to be fetched somehow, such as by maintaining the data to be written in the memory controller 2. Alternatively, the memory controller 2 may issue, for example, an erase command according to the instruction from the host device 3, and causes the MRAM 1 to erase the data including many errors or prohibit access to such data. By performing any one of these operations, it is possible to eliminate unreliable data.

As illustrated in FIG. 5, the determinator 144 may also determine whether the number of erroneous bits in the ECC word is equal to or smaller than N bits in step S14-2, in addition to the determination of the error of zero bit in the step S13 and the determination of the error of M bits in the step S14-1. The determinator 144 thus obtains the following determination results (a) to (d) regarding the number of the erroneous bits.

(a) Number of erroneous bits=0
(b) 0<Number of erroneous bits≤M bits
(c) M bits<Number of erroneous bits≤N bits
(d) N bits<Number of erroneous bits If the determination result (a) or (b) is obtained, the data has its error corrected and then transmitted to the memory controller 2, as described above (step S15).

If the determination result (c) or (d) is obtained, the alert is transmitted to the memory controller 2, as described above (step S17). Upon receipt of the alert (step S18-1), the memory controller 2 may respond differently depending on the determination result. That is, the memory controller 2 may respond to the determination result (c) by causing the MRAM 1 to perform, for example, the scrubbing operation (from step S18-2 to step S19-1) The memory controller 2 may also respond to the determination result (d) by causing the MRAM 1 to perform, for example, the re-writing of data (from step S18-2 to step S19-2).

Example of Scrubbing Operation

Data held in the memory cells MC may be flipped in response to an unintentional change of the resistance state of the MTJ elements. Such data come to include errors. Based on the this point, the errors in the data may be detected by the scrubbing operation and correct data is written back to the memory cells MC.

The controller 215 of the memory controller 2 causes the MRAM 1 to perform the scrubbing operation regularly or irregularly. The memory controller 2 may instruct the MRAM 1 to perform the scrubbing operation when the MRAM 1 comes to the idle state after, for example, a fixed time period has passed or the reading instruction or the like has been issued more than fixed times. The memory controller 2 may cause the scrubbing operation to be performed when the number of erroneous bits larger than M bits has been detected in the reading operation.

The MRAM 1 scrubs the memory cells MC sequentially for each scrubbing unit according to the addresses managed by the scrub controller 32 described above. It is not necessary, therefore, for the memory controller 2 to specify the address of the memory cell MC when causing the MRAM 1 to perform the scrubbing operation.

An example of the scrubbing operation of the memory system 10 will be described below by referring to FIG. 6. FIG. 6 illustrates the flow of the scrubbing operation of the memory system according to the present embodiment. FIG. 6 mainly illustrates the operation regarding error correction.

As illustrated in FIG. 6, the memory controller 2 issues a scrub command and transmits the scrub command to the MRAM 1 (step S21).

The input and output controller 16 of the MRAM 1 transfers the scrub command to the controller 15. The scrub command is received by the scrub controller 32 of the controller 15. Upon receipt of the scrub command, the scrub controller 32 reads data from the memory cells MC that correspond to an address that is managed by the scrub controller 32 and subjected to the scrubbing operation. That is, the scrub controller 32 controls the row decoder 12 and the column controller 13 to read data from the selected memory cells MC on the column controller 13.

The column controller 13 transfers the read data to the error correction circuit 14. The syndrome generator 143 calculates the syndrome (e.g., S1, S3, . . . , Sx) from the ECC word and parity included in the read data (step S22).

The determinator 144 determines whether the number of the erroneous bits in the ECC word is zero (step S23). If the number of the erroneous bits is zero, the flow of the scrubbing operation proceeds to step S28.

If the number of the erroneous bits is not zero, the determinator 144 determines whether the number of the erroneous bits in the ECC word is equal to or smaller than N bits (step S24).

If the number of the erroneous bits is equal to or smaller than N bits, the scrub controller 32 causes the ECC decoder 142N to perform correction of the error having the maximum of N bits on the ECC word (step S25). The scrub controller 32 is controlled by the read and write controller 31 to write back the error-corrected data to the memory cells MC that have been a target of the scrubbing operation (step S26).

The writing-back operation (re-writing operation) of data to the memory cells MC is performed without receiving a command, data, or an address from the memory controller 2. The rest of the writing-back operation of data is performed similarly to the writing operation mentioned above. That is, the error correction circuit 14 processes the error-corrected data into the sets of the ECC word and parity which are then written in the memory cells MC by the scrub controller 32.

If the number of the erroneous bits is larger than N bits, the error correction circuit 14 issues an alert, and the controller 15 transmits the alert to the memory controller 2 (step S27).

The memory controller 2 determines whether the alert is at the "H" level (step S28). If the alert is at the "L" level, the memory controller 2 determines that the scrubbing operation has completed.

If the alert is at the "H" level and, for example, the memory controller 2 holds the data then, the memory controller 2 issues the write command to cause the MRAM 1 to execute the writing operation (step S29). After the writing operation has completed, the memory controller 2 may cause the MRAM 1 to scrub data again. The memory controller 2 may respond to the occurrence of the alert by executing an operation other than writing.

(4) Advantages of Present Embodiment

According to the present embodiment, one or more advantages can be obtained based on the following features (A) or (B).

(A) According to the present embodiment, the error correction circuit 14 includes the ECC decoders 142M, 142N. When the data scrubbing is performed while no external access to the MRAM 1 is being made (i.e., during the idle time of the MRAM 1), the ECC decoder 142N corrects the error having the maximum of N bits for each data unit using the syndrome. When the data reading is performed, the ECC decoder 142M corrects the error having the maximum of M bits (M<N) for each data unit using the syndrome.

With the feature (A), the MRAM 1 can suppress the number of erroneous bits in the data within a desired range by scrubbing the data. The reliability of the data held in the memory cells MC can therefore be improved.

With the feature (A), the MRAM 1 can perform error correction using high correction ability during scrubbing. The reliability of the held data can therefore be further improved. Although it would take longer to perform error correction as the correction ability is further improved, the scrubbing is performed using the period of time when the MRAM 1 is in the idle state. Accordingly, a high speed performance of the entire memory system 10 including the MRAM 1 can be maintained.

With the feature (A), the MRAM 1 can transmit the read data quickly to the memory controller 2 by lowering the error correction ability during reading than during scrubbing. The high speed performance of the entire memory system 10 can therefore be enhanced.

With the feature (A), the MRAM 1 can sufficiently secure the reliability of the read data, because the erroneous bits are corrected even during reading so as long as the erroneous bits are equal to or smaller than M bits.

(B) In the present embodiment, the parity and the syndrome are generated to allow N-bit error to be detected.

With the feature (B) the two ECC decoders 142M, 142N can use a common parity and syndrome. The error correction circuit 14 can therefore include a simplified structure compared to the case when different types of parity and syndromes are used.

With the feature (B), the number of parity bits that occupy in data processed by the ECC encoder 141 can be suppressed when compared to the case where, for example, different types of parity and syndromes are necessary. This can be achieved because, if a common parity or the like is not used, two types of parity, for example, with one type for M-bit correction and the other type for N-bit correction, are connected with each other to an ECC word.

With the feature (B), the error correction of the error having the maximum of N bits can be performed even during reading. Accordingly, the data can be handled appropriately depending on the number of the detected errors. The reliability of the entire memory system 10 can therefore be improved.

Second Embodiment

The present embodiment will be described by referring to FIGS. 7 to 10.

The present embodiment is different from the above embodiment in that a memory controller 22, instead of an MRAM 21, includes an error correction circuit 24. Remaining parts of the present embodiment are similar to the above embodiment, in that the MRAM 21, the memory controller 22, and a memory system including the MRAM 21 and the memory controller 22 are similar to the MRAM 1, the memory controller 2, and the memory system 10, respectively, that have been described above.

(1) Example of Memory System Structure

Figure 7:
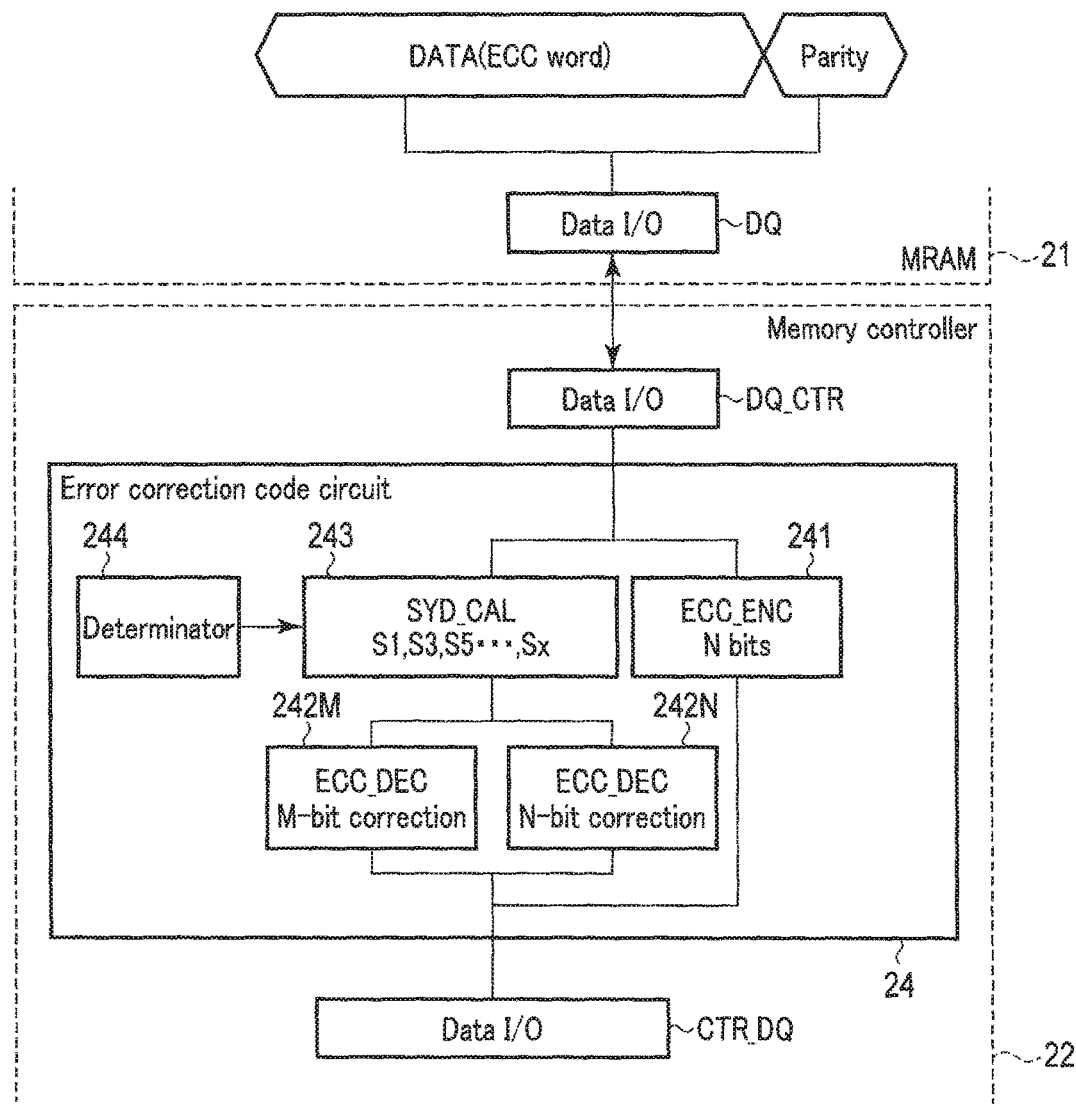
FIG. 7 schematically illustrates an example of the structure of an error correction circuit included in a memory controller according to a second embodiment.

An example of the structure of the MRAM 21 and the memory controller 22 according to the present embodiment will be described by referring to FIG. 7. FIG. 7 schematically illustrates an example of the structure of the error correction circuit included in the memory controller according to the present embodiment.

As illustrated in FIG. 7, the memory controller 22 includes an error correction circuit 24. The error correction circuit 24 includes an ECC encoder 241, ECC decoders 242M, 242N, syndrome generator 243, and a determinator 244.

With respect to transmitting and receiving of data, the error correction circuit 24 performs an operation different from that of the error correction circuit 14 of the above embodiment. The transmitting and receiving of data will be described later by using a flowchart of the operation.

Remaining parts of the error correction circuit 24 and components included therein are similar to the error correction circuit 14 described above. That is, the ECC encoder 241 is equivalent to the ECC encoder 141 of the error correction circuit 14. The ECC decoders 242M, 242N are equivalent to the ECC decoders 142M, 142N, respectively. The syndrome generator 243 is equivalent to the syndrome generator 143. The determinator 244 corresponds to the determinator 144.

(2) Operation Example of Memory System

Next, an operation example of the memory system of the present embodiment will be described by referring to FIGS. 8 to 10.

Example of Writing Operation

First, an example of the writing operation of the MRAM 21 and the memory controller 22 will be described.

During the writing operation, the error correction circuit 24 is controlled by the controller 215 of the memory controller 22 to receive and process write data before the memory controller 22 transmits the write data to the MRAM 21. The processed data is transmitted to the MRAM 21 by the memory controller 22 and written in the memory cells MC.

Example of Reading Operation

An example of the reading operation of the MRAM 21 and the memory controller 22 will now be described by referring to FIG. 8. FIG. 8 illustrates the flow of the reading operation of the memory system according to the present embodiment.

Figure 8:
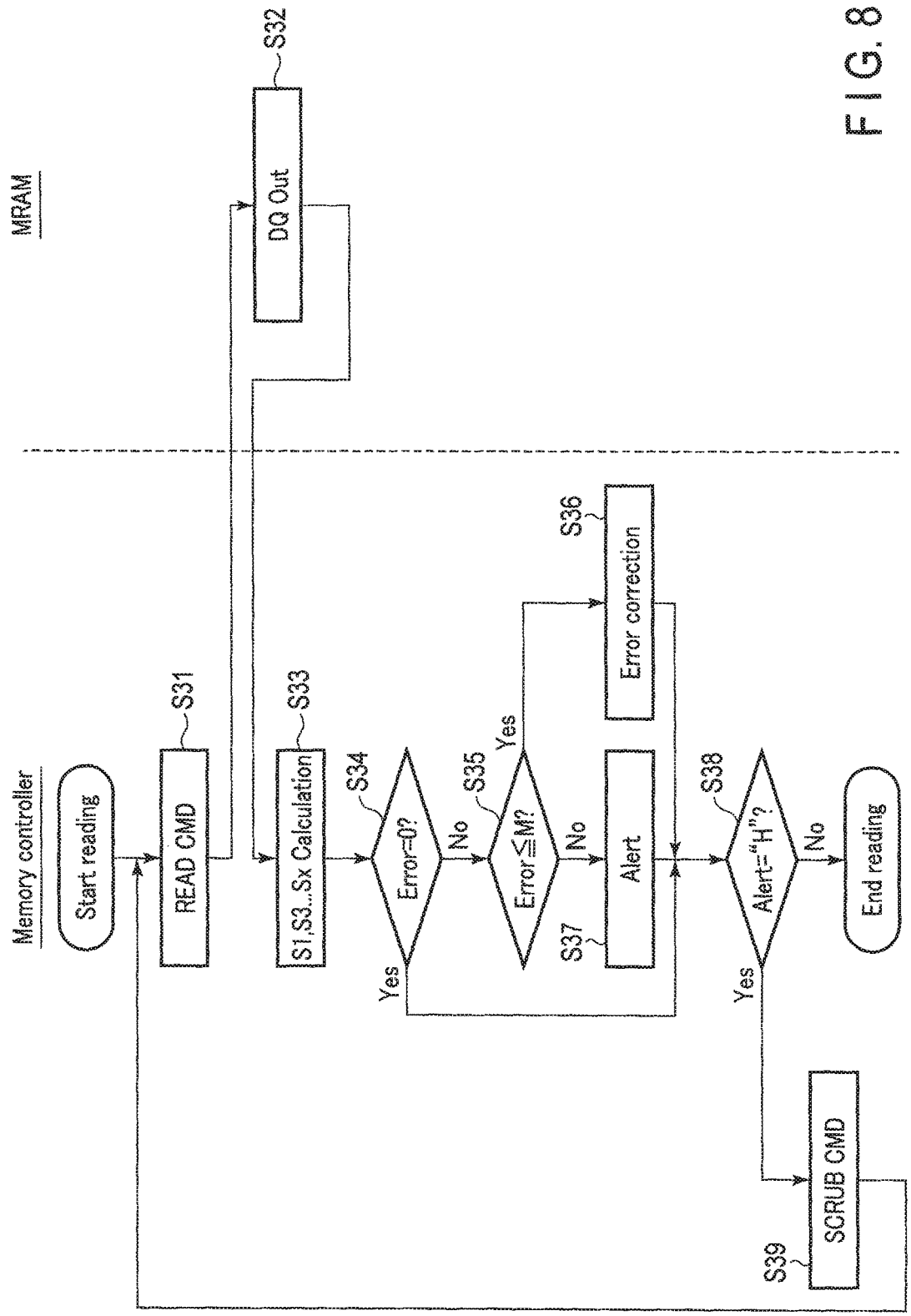
FIG. 8 illustrates the flow of a reading operation of the memory system according to the second embodiment.

As illustrated in FIG. 8, the controller 215 transmits a read command to the MRAM 21 together with a source address of reading (step S31).

A read and write controller 31 receives the read command to read data from the memory cells MC at the source address, and transmits the data as the read data to the memory controller 22 (step S32). The read data includes plural sets of the ECC word and parity. The read data is transmitted to the syndrome generator 243 and the ECC decoder 242M.

The syndrome generator 243 calculates the syndrome from the read data (step S33), and transmits the syndrome to the determinator 244. The determinator 244 determines whether the number of the erroneous bits in the read data is zero and, if not, determines whether the number of the erroneous bits is equal to or smaller than M bits (steps S34 to S35). A determination result is transmitted to the controller 215.

If the number of the erroneous bits is zero, the controller 215 neither performs error correction in the ECC decoder 242M nor writes back the data to the MRAM 1. The flow of reading then proceeds to step S38. In the step S38, the controller 215 determines whether the error correction circuit 24 has issued an alert. If the number of the erroneous bits is zero and no alert has been issued, the controller 215 completes the reading operation.

Meanwhile, if the number of the erroneous bits is more than zero and equal to or smaller than M bits, the controller 215 causes the ECC decoder 242M to perform the error correction on the read data (step S36). If the number of the erroneous bits is more than M bits, the error correction circuit 24 issues an alert (step S37). The steps S36, S37 continue to the step S38.

In the step S38, when determined that the alert has been issued, the controller 215 causes the MRAM 1 to perform the scrubbing operation or the like (step S39). Alternatively, the memory controller 22 may perform various responses as mentioned in connection with FIG. 4.

The determinator 244 of the present embodiment may also perform determination of the error of N bits, in addition to the determination of error of 0 bit and M bits, as illustrated in FIG. 5.

Example of Scrubbing Operation

An example of the scrubbing operation of the MRAM 21 and the memory controller 22 will now be described by referring to FIG. 9. FIG. 9 illustrates the flow of the scrubbing operation of the memory system according to the present embodiment.

Figure 9:
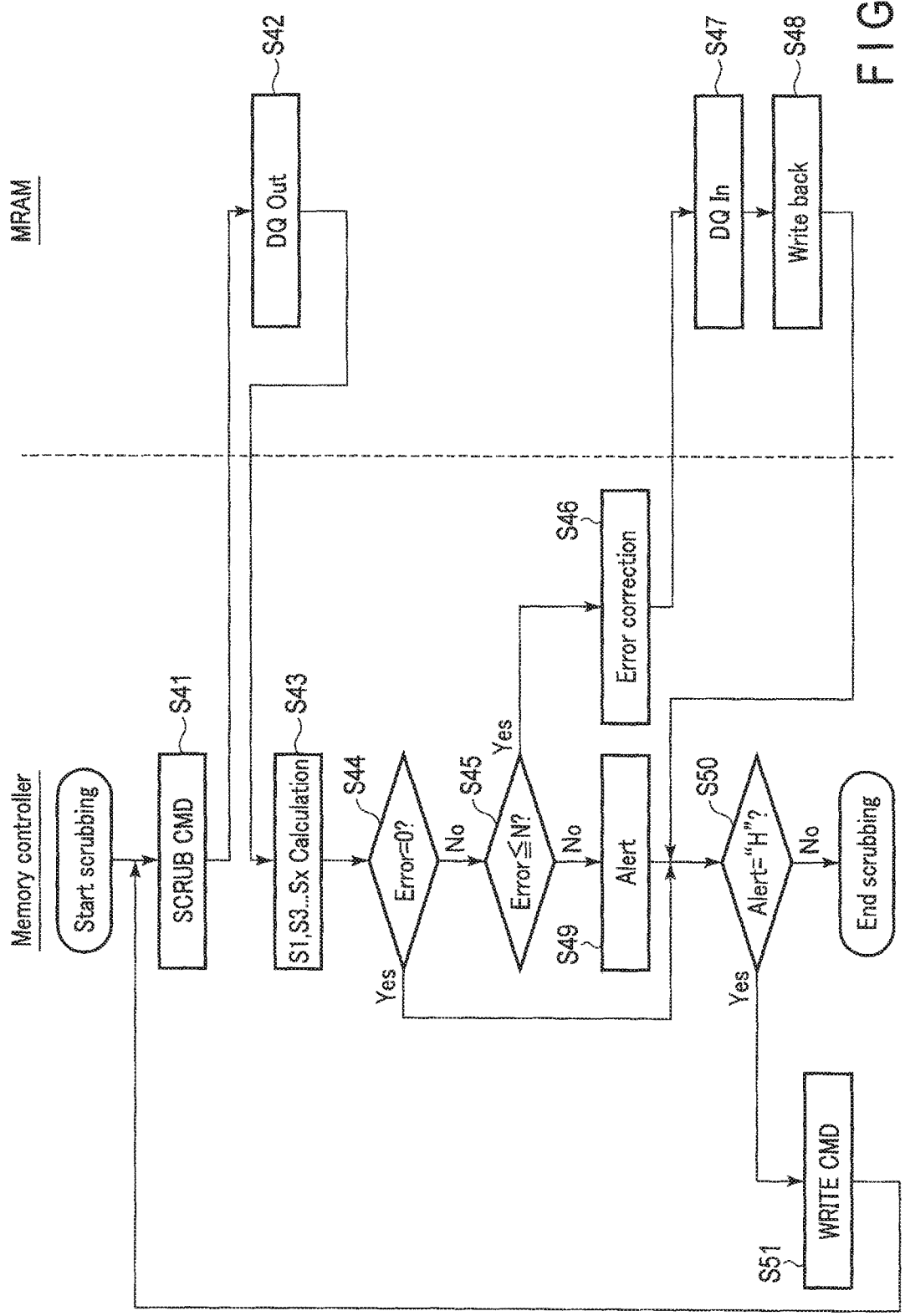
FIG. 9 illustrates the flow of a scrubbing operation of the memory system according to the second embodiment.

As illustrated in FIG. 9, the controller 215 of the memory controller 22 transmits the scrub command to the MRAM 21 (step S41).

Upon receipt of the scrub command, the scrub controller 32 of the MRAM 21 is controlled by the read and write controller 31 to read data from the memory cells MC located at an address held in the counter CN and transmit the data to the memory controller 22 as the read data (step S42). The read data includes plural sets of the ECC word and parity. The read data is transmitted to the syndrome generator 243 and the ECC decoder 242N.

The memory controller 22 then executes steps S43 to S46, or steps S43 to S45, 949, and S50. The steps S43 to S46, S49, and S50 are similar to the steps S33 to S38 of FIG. 8 described above, except that the number of the erroneous bits is N bits, instead of M bits, and the ECC decoder 242N instead of the ECC decoder 242M is included in the description of the steps S33 to S38 of FIG. 8.

Subsequent to the step S46, the controller 215 transmits the error-corrected data to the MRAM 21 (step S47). When the MRAM 21 has received the data, the scrub controller 32 refers to the counter CN to learn the address of the memory cells MC that has been a target of the scrub command in the step S41, and writes back the received data to the memory cells MC at this address (step S48). The step S48 continues to step S50.

In the step S50, if no alert has been issued, the controller 215 determines that the scrubbing operation has completed.

In contrast, in the step S50, if the alert has been issued, the controller 215 causes the MRAM 21 to execute the writing operation or the like, as in the step S29 of FIG. 6 (step S51). Alternatively, the controller 215 may perform a response other than execution of writing.

As described above, the MRAM 21 does not include the error detecting function nor has the error correcting function. For example, during the writing, reading, and scrubbing operations, the MRAM 21 writes data as it is received from the memory controller 22 to the memory cells MC and transmits the data as it is read from the memory cells MC to the memory controller 22.

Such interaction between the MRAM 21 and the memory controller 22 will further be described in the following.

Example of Command Sequence in Memory System

An example of a command sequence between the MRAM 21 and the memory controller 22 in the above operations will be described by referring to FIG. 10. FIG. 10 is an example of the command sequence in the memory system according to the present embodiment. The command sequence illustrated in FIG. 10 is an example of two reading operations and a subsequent scrubbing operation. In a reading operation described below, it is assumed that the determinator 244 performs the entire error determination of 0 bit, M bits, and N bits, similar to the example illustrated in FIG. 5.

Figure 10:
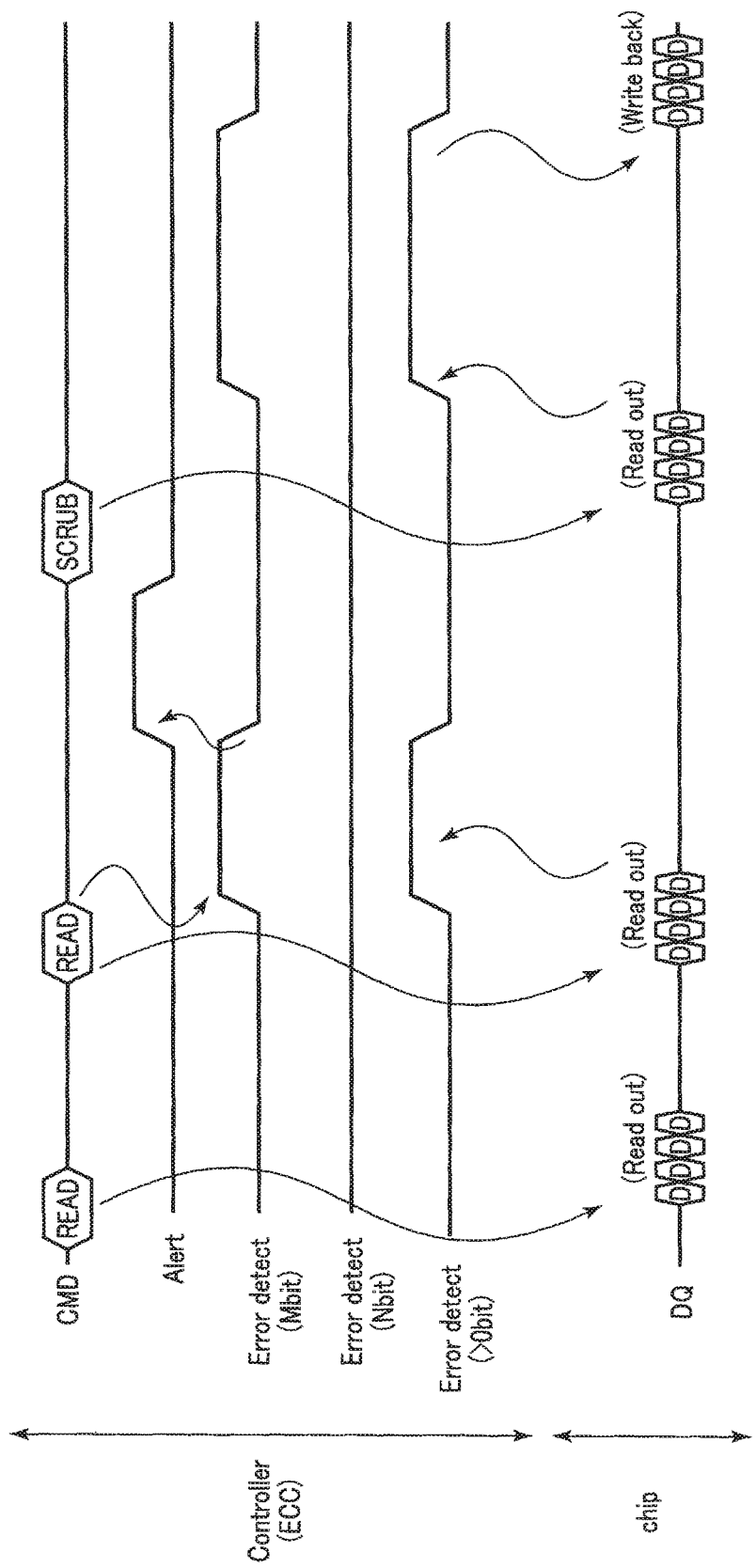
FIG. 10 illustrates an example of a command sequence in the memory system according to the second embodiment.

In FIG. 10, a command signal CMD is transmitted to the input and output controller 16 of the MRAM 21 from the memory controller 22 via a command line included in, for example, the connecting line 5. An error detection signal (>0 bit), an error detection signal (>N bits), and an error detection signal (>M bits) are controlled by, for example, the determinator 244 and referred to by the controller 215. The error detection signal (>0 bit) is set to the "L" level when the detected number of the erroneous bits is 0 bit, whereas the signal is set to the "H" level when the detected number the erroneous bits exceeds 0 bit. The error detection signal (>N bits) is set to the "L" level when the detected number of the erroneous bits is equal to or smaller than N bits, whereas the signal is set to the "H" level when the detected number of the erroneous bits exceeds N bits. The error detection signal (>N bits) is controlled set to the level "L" when the detected number of erroneous bits is equal to or smaller than M bits, whereas the signal is set to the "H" level when the detected number of erroneous bits exceeds M bits.

As illustrated in FIG. 10, when a first reading operation is started, the controller 215 transmits a read command to the MRAM 21 on the command line.

Upon receipt of the read command, the read and write controller 31 reads data from the read-target memory cells MC and transmits the read data to the memory controller 22 via the data bus included in the connecting line 5. The read data is received by the syndrome generator 243. The syndrome generator 243 generates a syndrome. The syndrome is subjected to error determination by the determinator 244. The determinator 244 uses using the syndrome to determine the number of the erroneous bits included in the read data.

Regarding the read data obtained from the first reading operation, the determinator 244 determines, for example, that the number of the erroneous bits is zero. The determinator 244 therefore maintains all the error detection signal (>0 bit), the error detection signal (>M bits), and the error detection signal (>N bits) at the "L" level. The controller 215 receives these three error detection signals and, based on which, recognizes that the number of the erroneous bits is zero. The controller 215 therefore does not cause the ECC decoder 242M to perform the error correction of the data.

Subsequently, when a second reading operation is started, the controller 215 transmits a read command to the MRAM 21 on the command line.

Upon receipt of the read command, the MRAM 21 reads data from the read-target memory cells MC and transmits the read data to the memory controller 22. Next, similar to the procedures of the first reading operation, the determinator 244 determines, for example, that the number of the erroneous bits has exceeded M bits. The determinator 244 then changes the state of the error detection signal (>0 bit) and the error detection signal (>M bits) to the "H" level, whereas maintaining the state of the error detection signal (>N bits) to the "L" level, and transmits these signals to the controller 215. The controller 215 receives the error detection signal (>0 bit) of the "H" level and the error detection signal (>M bits) of the "H" level and, based on which, recognizes that the number of the erroneous bits has exceeded M bits. Since the detected number of the erroneous bits has exceeded M bits, the controller 215 does not cause the ECC decoder 242M to perform the error correction and issues an alert to the host device 3. In response to the detected number of the erroneous bits over M bits, the controller 215 takes an appropriate measure as needed. In the example illustrated in FIG. 10, the controller 215 causes the MRAM 21 to perform the scrubbing operation.

When the scrubbing operation is started, the controller 215 transmits a scrub command on the command line to the MRAM 21.

Upon receipt of the scrub command, the scrub controller 32 reads data from the scrub-target memory cells MC and transmits the read data to the memory controller 22 on the data bus. The scrub-target memory cells MC are the memory cells MC that have been a target of the second reading operation. The data read from the scrub-target memory cells MC is received by the error correction circuit 24. The error correction circuit 24 determines the number of the erroneous bits included in the read data by the procedures similar to those of the first and second reading operations.

The determinator 244 determines, for example, that the number of the erroneous bits included in the read data is not zero and equal to or smaller than N bits. That is, it is determined that the number of the erroneous bits is within a correctable range by the ECC decoder 242N. The determinator 244 changes the state of the error detection signal (>0 bit) to the "H" level. The controller 215 receives the error detection signal (>0 bit) of the "H" level and the error detection signal (>N bits) of the "L" level and, based on which, recognizes that the number of erroneous bits is equal to or smaller than N bits.

The controller 215 therefore causes the ECC decoder 242N to perform the error correction of the data.

The controller 215 transmits the error-corrected data to the MRAM 21 on the data bus. The read and write controller 31 writes back the corrected data to the source memory cells MC. The controller 215 does not issue a new command, such as a data write-back command. The scrub command includes an instruction to write back the data. When the MRAM 21 receives the scrub command without receiving other commands, the MRAM 21 writes back the received data to the source memory cells MC according to the scrub command.

(3) Advantages of Present Embodiment

In the present embodiment, the memory controller 22 includes the ECC decoders 242M, 242N. This produces one or more advantages mentioned below in addition to the advantages of the above embodiment.

The MRAM 21 may not include the error correction function. Accordingly, no space in the MRAM 21 for an error detection function is consumed. A space in the chip of the MRAM 21 can therefore be used for other uses, or the MRAM 21 can be smaller.

The processing ability of the MRAM 21 is not consumed for the error correction. A processing ability of the MRAM 21 can be used for other uses or the operation speed of the MRAM 21 can be increased.

The memory controller 22 includes the error correction function. The need for reducing the size of the memory controller 22 is not so strict than that for the MRAM 21. It is therefore relatively easy to allocate the space in the chip of the memory controller 22 for the error correction circuit 24.

The memory controller 22 can assume error correction. The processing ability of the memory controller 22 is significantly larger than that of the MRAM 21. The memory controller 22 can therefore perform the error correction without substantially losing the operating characteristic of the memory controller 22.

Third Embodiments

The present embodiment will be described by referring to FIGS. 11 to 13.

The present embodiment is different from the above embodiments in that an error correction circuit 54 is distributed in an MRAM 51 and a memory controller 52. Remaining parts of the present embodiment are similar to the above embodiments, in that the MRAM 51, the memory controller 52, and the memory system including the MRAM 51 and the memory controller 52 are similar to the MRAM 1, the memory controller 2, and the memory system 10, respectively, that have been described above.

(1) Example of Memory System Structure

An example of the structure of the MRAM 51 and the memory controller 52 according to the present embodiment will be described below by referring to FIG. 11. FIG. 11 schematically illustrates an example of the structure of the error correction circuit included in the memory system according to the present embodiment.

As illustrated in FIG. 11, the MRAM 51 includes an error correction circuit 54M, which is a part of the error correction circuit 54. The error correction circuit 54M includes an ECC encoder 541, an ECC decoder 542M, syndrome generator 543, and a determinator 544.

The memory controller 52 includes an error correction circuit 54N, which is a part of the error correction circuit 54. The error correction circuit 54N includes an ECC decoder 542N.

With respect to transmitting and receiving of data, the error correction circuit 54 performs operations different from those of the error correction circuit 14 of the above embodiments. The transmitting and receiving of data will be described later by using a flowchart of the operation.

Remaining parts of the error correction circuit 54 and components included therein are similar to those of the error correction circuit 14 described above. That is, the ECC encoder 541 is equivalent to the ECC encoder 141 of the error correction circuit 14. The ECC decoders 542M, 542N are equivalent to the ECC decoders 142M, 142N, respectively. The syndrome generator 543 is equivalent to the syndrome generator 143. The determinator 544 is equivalent to the determinator 144.

(2) Operation Example of Memory System

An operation example of the memory system of the present embodiment will now be described by referring to FIGS. 12 and 13.

Example of Writing Operation

The error correction circuit 54M in the MRAM 51 includes all necessary components required to process write data to achieve the error correction of N bits for each data unit. That is, the MRAM 51 includes all necessary functions required for writing of data to complete the data writing processing in the MRAM 51.

The flow of the writing operation of the MRAM 51 and the memory controller 52 is the same as the flow of the first embodiment described above.

Example of Reading Operation

The error correction circuit 54M in the MRAM 51 includes all necessary components required to process read data to achieve the error correction of M bits for each data unit. That is, the MRAM 51 includes all necessary functions required for reading of data to complete the data reading processing in the MRAM 51.

The flow of the reading operation of the MRAM 51 and the memory controller 52 is identical to the flow illustrated in FIGS. 4 and 5.

Example of Scrubbing Operation

The necessary function for the data scrubbing operation is separately provided in the MRAM 51 and the memory controller 52.

An example of the scrubbing operation of the MRAM 51 and the memory controller 52 will now be described by referring to FIG. 12. FIG. 12 illustrates the flow of the scrubbing operation of the memory system according to the present embodiment.

Figure 12:
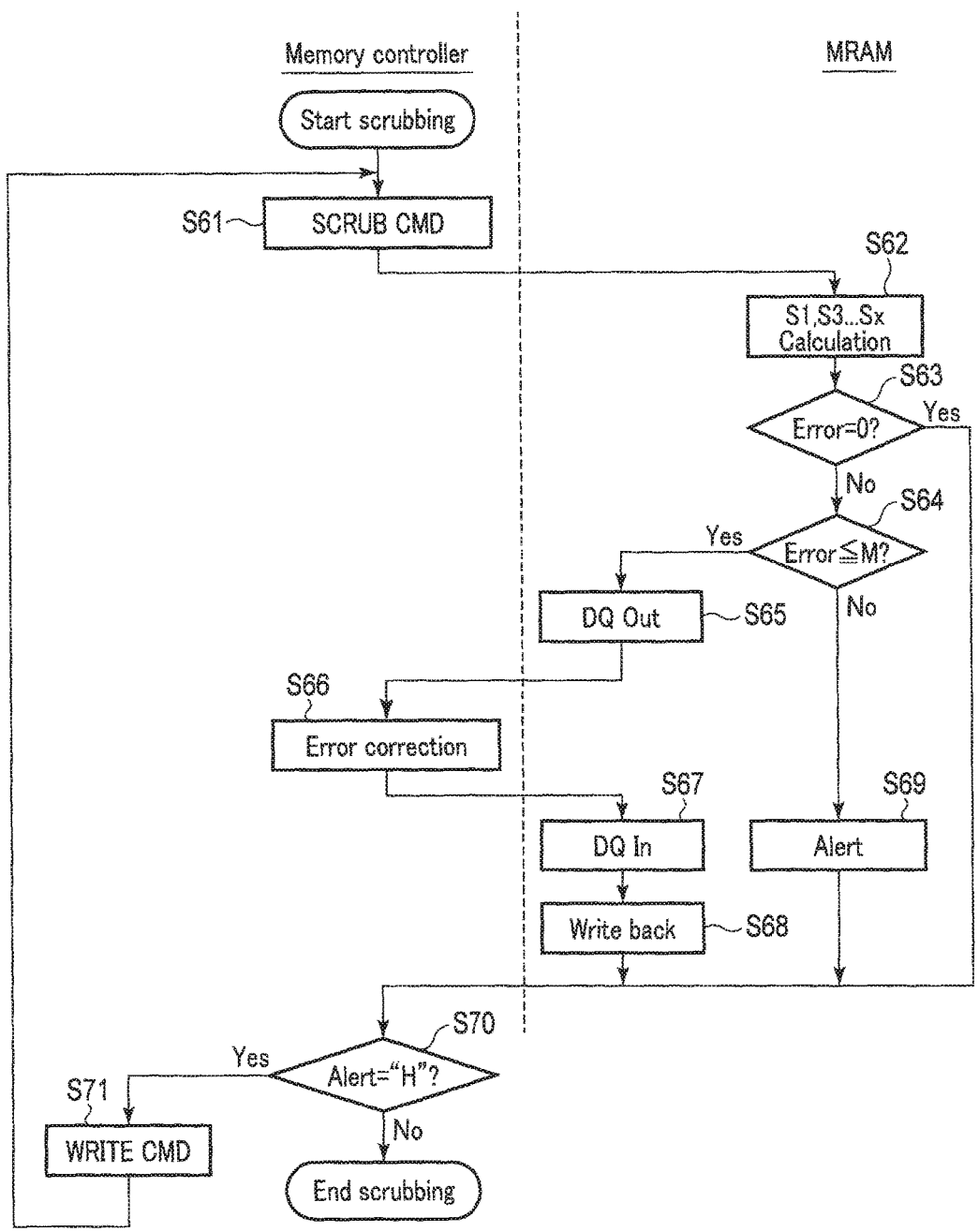
FIG. 12 illustrates the flow of a scrubbing operation of the memory system according to the third embodiment.

As illustrated in FIG. 12, the controller 215 of the memory controller 52 transmits a scrub command to the MRAM 51 (step S61).

Upon receipt of the scrub command, the scrub controller 32 of the MRAM 51 is controlled by the read and write controller 31 to read data from the memory cells MC at the address held in the counter CN.

The error correction circuit 54M then executes steps S62 to S64 and S68, or steps S62 to S64 and S69. The steps S62 to S64 and S68 are similar to the steps S22 to S24 and S26, respectively, of FIG. 6. The step S66 equivalent to the step S25 of FIG. 6 is performed by the ECC decoder 542N through control of the controller 215 of the memory controller 52. Therefore, the syndrome calculated in the step S62 is transmitted to the memory controller 52 together with the error determination result from the steps S63, S64 (step S65). In addition, the data error-corrected in the step S66 is retransmitted to the MRAM 51 (step S67), and the step S68 is then performed. The above steps S62 to S64 and S69 are similar to the steps S22 to S24 and S27, respectively, of FIG. 6.

In step S70, if no alert has been issued, the controller 215 determines that the scrubbing operation has completed.

In contrast, in the step S70, if the alert has been issued, the controller 215 causes the MRAM 51 to execute the writing operation or the like, as in the step S29 of FIG. 6 above (step S71). Alternatively, the controller 215 may perform a response other than execution of writing.

As described above, the MRAM 51 can autonomously process, during the writing and reading operations, the data received from the memory controller 52 in the error correction circuit 54M of the MRAM 51 itself. In the scrubbing operation, for example, the MRAM 51 cannot complete the process the data received by the memory controller 52 in the error correction circuit 54M. The MRAM 51 transmits the syndrome calculated from the received data to the memory controller 52 which, in turn, performs the error correction.

Such interaction between the MRAM 51 and the memory controller 52 will further be described in the following using a command sequence.

Example of Command Sequence in Memory System

An example of a command sequence between the MRAM 51 and the memory controller 52 in the above operations will be described by referring to FIG. 13. FIG. 13 is an example of the command sequence in the memory system according to the present embodiment. The command sequence illustrated in FIG. 13 is an example of two reading operations and a subsequent scrubbing operation. In a reading operations described below, it is assumed that the determinator 544 performs the entire error determination of 0 bit, M bits, and N bits, similar to the example illustrated in FIG. 5 above.

The description will be given of differences between the command sequence of the present embodiment and that of the example of FIG. 10 above.

Figure 13:
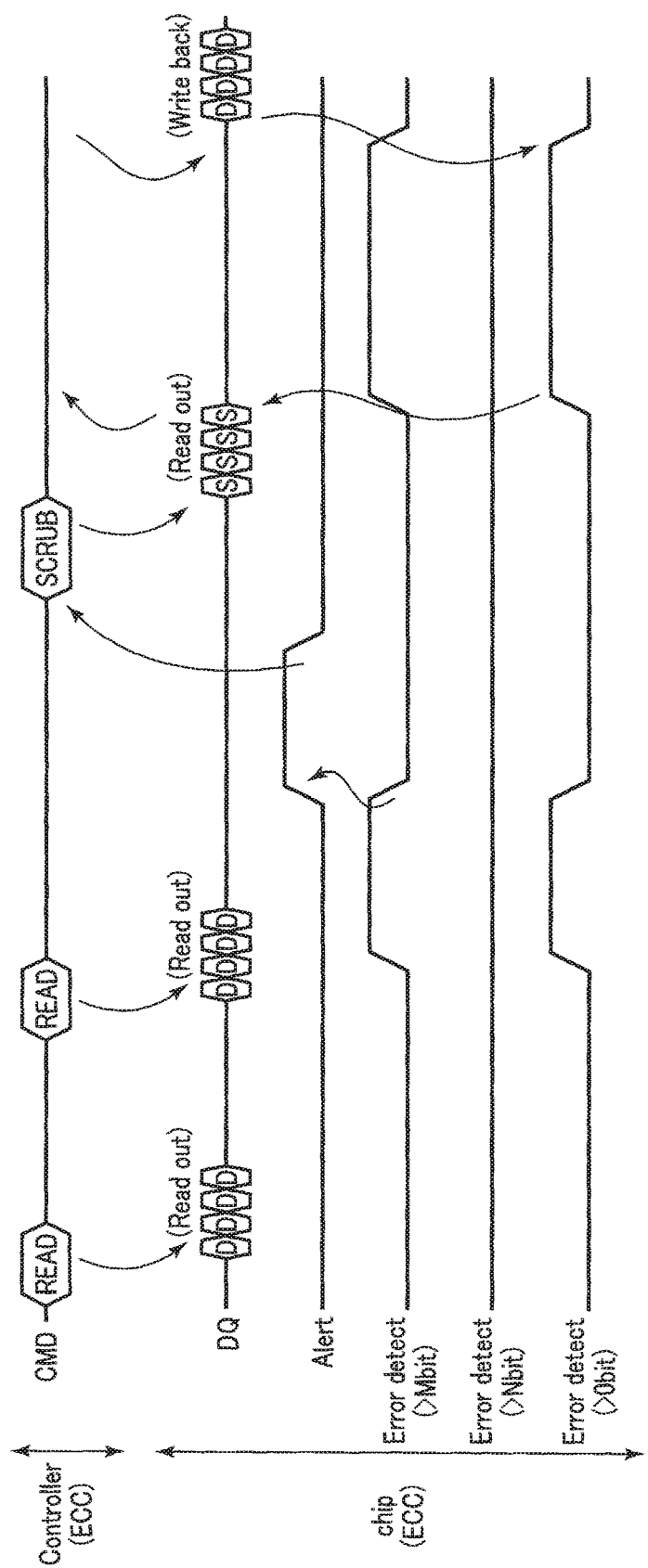
FIG. 13 illustrates an example of a command sequence in the memory system according to the third embodiment.

As illustrated in FIG. 13, a first reading operation differs from that of FIG. 10 in that a syndrome calculated by the syndrome generator 543 is used for error determination by a determinator 544, and then the read data is transmitted to the memory controller 52.

A second reading operation differs from that of FIG. 10 in that an alert is transmitted from the controller 15 to the memory controller 52 in response to the receipt of the error determination by the determinator 544.

The scrubbing operation differs from that of FIG. 10 in that the syndrome calculated by the syndrome generator 543 in response to the scrub command is transmitted to the memory controller 52 together with the result of the error determination by the determinator 544.

Further, the scrubbing operation differs from that of FIG. 10 in that the syndrome transmitted to the memory controller 52 error-corrected by the ECC decoder 542N, transmitted to the MRAM 51, and written back to the target memory cells MC.

The example of the error correction circuit 54M of the MRAM 51 including the syndrome generator 543 has been described, but the example is not limited thereto. In addition to or in place of the syndrome generator 543 of the error correction circuit 54M, the memory controller 52 may include a syndrome generator. That is, both the MRAM 51 and the memory controller 52 may include a syndrome generator. Thus, the memory controller 52 can consistently perform the error correction during the scrubbing without causing the MRAM 51 to calculate the syndrome during the scrubbing.

The example of the error correction circuit 54M in the MRAM 51 executing the error correction circuit has been described above, but the example is not limited thereto. For example, in addition to or in place of the the determinator 544 of the error correction circuit 54M, the error correction circuit 54N of the memory controller 52 may include a determinator and uses the syndrome transmitted from the MRAM 51 to perform the error correction. In this case, the memory controller 52 may appropriately respond to the result of the error determination by correcting the error, issuing the alert, and so on.

(3) Advantages of Present Embodiment

In the present embodiment, the memory controller 52 includes the ECC decoder 542N and the MRAM 51 includes the ECC decoder 542M. This produces one or more advantages mentioned below in addition to the advantages of the above embodiments.

The MRAM 51 may not include, among the N-bit and M-bit error correction functions, the N-bit error correction function. The ECC decoder 542N that implements the N-bit error correction function needs to have capacity and an occupying area larger than those of the ECC decoder 542M that implements the M-bit error correction function. Since the MRAM 51 is not responsible for the N-bit error correction function, space in the chip of the MRAM 51 can be used for other uses and the MRAM 51 can be smaller.

The MRAM 51 may not include the N-bit error correction function. Implementing the N-bit error correction function requires the processing ability larger than that for implementing the M-bit error correction function. Since the MRAM 51 is not responsible for the N-bit error correction function, the processing ability in the MRAM 51 can be used for other uses and the operation speed of the MRAM 51 can be improved.

The memory controller 52 thus includes the ECC decoder 542N. An impact of providing the ECC decoder 542N in the space of the chip of the memory controller 52 can be at an allowable level.

The memory controller 52 can thus possess the error correction function of N-hit errors. An impact of performing the error correction of N-bit errors on the processing ability of the memory controller 52 can be at an allowable level.

Other Embodiments

In the embodiments described above, the description has been given of the example of using the same syndrome derived from the same parity during the error correction of both N-bit errors and M-bit errors, but the example is not limited thereto. The error correction of N-bit errors and M-bit errors may comply with different error correction code generation rules, two different types of parity may be concatenated to a section of data (a ECC word), and a syndrome may be calculated individually. During the error correction of the N-bit errors and the M-bit errors, different syndromes are calculated according to the parity corresponding to either N-bit errors or M-bit errors.

The MTJ element described in the above embodiments may be a perpendicularly magnetized MTJ element having perpendicular magnetic anisotropy or a horizontally magnetized MTJ element having horizontal magnetic anisotropy. The MTJ element may be a bottom-free type (top pin type) MTJ element in which a second magnetic layer (having a variable magnetization orientation) lies below a first magnetic layer (having an invariable magnetization direction). The MTJ element may also be a top-free type (bottom pin type) MTJ element in which a second magnetic layer lies above the first magnetic layer.

In the above embodiments, the description has been given of the example in which the memory device if a MRAM which uses the MTJ elements as memory elements; however the example is not limited thereto. The memory device may be implemented, for example, a resistive random access memory (ReRAM), a phase change random access memory (PRAM or PCRAM), and so on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A memory device comprising:
   memory elements which store data and parity;
   a first decoder which, when a first operation including checking of the data is performed while no external access is being made to the memory device, uses a syndrome generated from the data and the parity to correct an error of a maximum of a first number of bits in a unit of the data; and
   a second decoder which, when reading of the data is performed, uses the syndrome to correct an error of a maximum of a second number of bits in a unit of the data,
   wherein the second number of bits is smaller than the first number of bits,
   wherein in response to a first command, the memory device:
      reads the data and the parity from the memory elements,
      generates the syndrome from the data and the parity, and
      uses the syndrome to correct the error of the data, and
   wherein in response to a read command, the memory device:
      reads the data and the parity from the memory elements,
      generates the syndrome from the data and the parity,
      uses the syndrome to correct the error of the data, and
      transmits the data in which the error has been corrected.

2. The memory device according to claim 1, further comprising:
an encoder which generates the parity from data to be written in the memory elements; and
a syndrome generator which generates the syndrome from the data and the parity,
wherein the parity and the syndrome are generated to allow an error of the first number of bits to be detected.

3. The memory device according to claim 1, wherein when the first operation is performed, the data in which the error has been corrected is written in the memory elements.

4. The memory device according to claim 1, wherein during the first operation, an alert is issued when a number of erroneous bits in a unit of the data is larger than the first number of bits.

5. The memory device according to claim 1, wherein during the first operation, data received externally is re-written when a number of erroneous bits in a unit of the data is larger than the first number of bits.

6. The memory device according to claim 1, wherein during the reading of the data, an alert is issued when a number of erroneous bits in a unit of the data is larger than the second number of bits.

7. The memory device according to claim 1, wherein during the reading of the data, the first operation is performed or data received externally is re-written when a number of erroneous bits in a unit of the data is larger than the second number of bits.

8. A memory system comprising:
a memory device including memory elements which store data and parity;
a memory controller which controls the memory device; and
a host device which controls the memory controller,
wherein during a first operation including checking of the data, the memory controller:
transmits a first command to the memory device to read the data and the parity from the memory elements while no external access is being made to the memory device,
generates a syndrome from the data and the parity, and
uses the syndrome to correct an error of a maximum of a first number of bits in a unit of the data,
wherein during reading of the data, the memory controller:
transmits a read command to the memory device, and reads the data and the parity from the memory elements,
generates a syndrome from the data and the parity, and
uses the syndrome to correct an error of a maximum of a second number of bits in a unit of the data, and
wherein the second number of bits is smaller than the first number of bits.

9. The memory system according to claim 8, wherein the parity and the syndrome are generated to allow an error of the first number of bits to be detected.

10. The memory system according to claim 8, wherein the memory controller includes:
an encoder which generates the parity,
a syndrome generator which generates the syndrome,
a first decoder which corrects the error of the maximum of the first number of bits in a unit of the data, and
a second decoder which corrects the error of the maximum of the second number of bits in a unit of the data.

11. The memory system according to claim 8, wherein:
during the first operation, the memory controller transmits the data in which the error has been corrected to the memory device, and
the memory device writes the data in which the error has been corrected to the memory elements.

12. The memory system according to claim 8, wherein the memory controller issues an alert when a number of erroneous bits in a unit of the data is larger than the first number of bits during the first operation, or when a number of erroneous bits in a unit of the data is larger than the second number of bits during the reading of the data.

13. The memory system according to claim 8, wherein:
during the first operation, the memory controller retransmits the data for writing together with a write command when a number of erroneous bits in a unit of the data is larger than the first number of bits, and
during the reading of the data, the memory controller transmits the first command to the memory device, or retransmits the data for the writing together with the write command when a number of erroneous bits in a unit of the data is larger than the second number of bits.

14. A memory system comprising:
a memory device including memory elements which store data and parity;
a memory controller which controls the memory device; and
a host device which controls the memory controller,
wherein:
during a first operation, the memory controller transmits a first command to the memory device while no external access is being made to the memory device,
in response to the first command, the memory device reads the data and the parity from the memory elements, generates a syndrome from the data and the parity, and transmits the syndrome to the memory controller,
upon receipt of the syndrome, the memory controller uses the syndrome to correct an error of a maximum of a first number of bits in a unit of the data,
during reading of the data, the memory controller transmits a read command to the memory device,
in response to the read command, the memory device reads the data and the parity from the memory elements, generates a syndrome from the data and the parity, uses the syndrome to correct an error of a maximum of a second number of bits in a unit of the data, and transmits the data in which the error has been corrected to the memory controller, and
wherein the second number of bits is smaller than the first number of bits.

15. The memory system according to claim 14, wherein the parity and the syndrome are generated to allow an error of the first number of bits to be detected.

16. The memory system according to claim 14, wherein:
the memory controller includes a first decoder which corrects the error of the maximum of the first number of bits in a unit of the data, and
the memory device includes an encoder which generates the parity, a syndrome generator which generates the syndrome, and a second decoder which corrects the error of the maximum of the second number of bits in a unit of the data.

17. The memory system according to claim 14, wherein:
during the first operation, the memory controller transmits the data in which the error has been corrected to the memory device, and the memory device writes the data in which the error has been corrected to the memory elements.

18. The memory system according to claim 14, wherein:
during the first operation, the memory controller issues an alert when a number of erroneous bits in a unit of the data is larger than the first number of bits, and
during the reading of the data, the memory device issues an alert when a number of erroneous bits in a unit of the data is larger than the second number of bits.

19. The memory system according to claim 14, wherein:
during the first operation, the memory controller retransmits the data for writing together with a write command when a number of erroneous bits in a unit of the data is larger than the first number of bits, and
during the reading of the data, the memory controller transmits the first command to the memory device, or retransmits the data for the writing together with the write command, when a number of erroneous bits in a unit of the data is larger than the second number of bits.

* * * * *